United States Patent [19]
Kim et al.

[11] Patent Number: 6,146,715
[45] Date of Patent: Nov. 14, 2000

[54] METHOD OF FABRICATING ORGANIC ELECTROLUMINESCENT DISPLAY PANEL

[75] Inventors: Chang Nam Kim, Seoul; Yoon Heung Tak, Kyungki-do; Sung Tae Kim, Seoul, all of Rep. of Korea

[73] Assignee: LG Electronics Inc., Seoul, Rep. of Korea

[21] Appl. No.: 09/261,254

[22] Filed: Mar. 3, 1999

[30] Foreign Application Priority Data

Jun. 17, 1998 [KR] Rep. of Korea .................. 98/22756

[51] Int. Cl.$^7$ .................. B05D 3/06; B05D 5/06
[52] U.S. Cl. .................. 427/555; 427/64; 427/68; 427/556; 216/17; 216/18; 216/94; 430/293; 430/317; 430/319
[58] Field of Search .................. 427/510, 555, 427/74, 75, 66, 64, 68, 556; 216/17, 18, 65, 94, 87; 430/292, 293, 297, 311, 316, 317, 318, 319

[56] References Cited

U.S. PATENT DOCUMENTS

| | | | |
|---|---|---|---|
| 4,117,177 | 9/1978 | Schlafer | 427/555 |
| 4,617,085 | 10/1986 | Cole, Jr. et al. | 427/555 |
| 4,652,462 | 3/1987 | Nishizawa et al. | 427/555 |
| 5,281,450 | 1/1994 | Yaniv | 427/555 |
| 5,302,423 | 4/1994 | Tran et al. | 427/555 |
| 5,314,709 | 5/1994 | Doany et al. | 427/555 |
| 5,340,619 | 8/1994 | Chen et al. | 427/555 |
| 5,386,430 | 1/1995 | Yamagashi et al. | 427/555 |
| 5,693,962 | 12/1997 | Shi et al. | 257/89 |
| 5,701,055 | 12/1997 | Nagayama et al. | 313/504 |
| 5,824,374 | 10/1998 | Bradley, Jr. et al. | 427/555 |
| 5,953,585 | 9/1999 | Miyaguchi . | |

FOREIGN PATENT DOCUMENTS 8-315981  11/1996  Japan .
9-293589  11/1997  Japan .

*Primary Examiner*—Marianne Padgett
*Attorney, Agent, or Firm*—Fleshner & Kim, LLP

[57] ABSTRACT

A method of fabricating an organic EL display panel accomplishes pixelation without using a shadow mask, and without exposing active EL elements to solvents from photoresist, or developing and stripping solutions. A first electrode layer and an insulating layer are formed on a transparent substrate. Portions of the insulating layer are removed at predetermined regions using at least one laser beam. An organic function layer and a second electrode layer are then formed on the predetermined regions. The first electrode layer, the organic layer and the second electrode layer form a sub-pixel. Additional sub-pixels are formed using the same method.

16 Claims, 19 Drawing Sheets

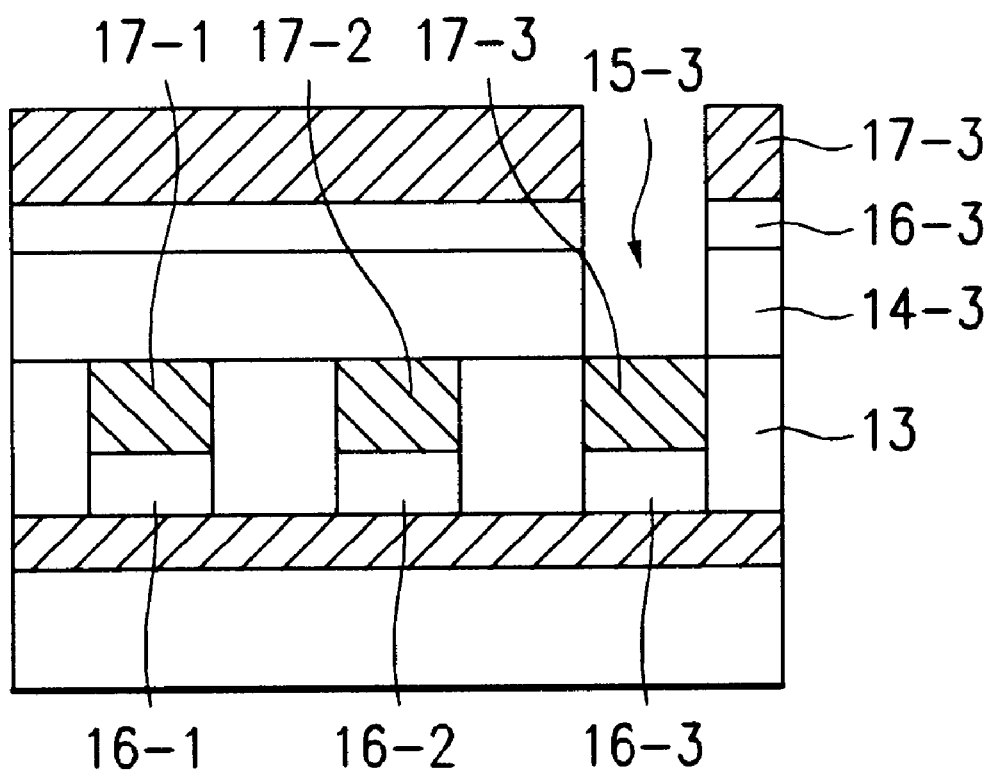

METHOD OF FABRICATING ORGANIC ELECTROLUMINESCENT DISPLAY PANEL

BACKGROUND OF THE INVENTION

1. Field of the Invention

The present invention relates to a novel method of fabricating an organic electroluminescent (hereinafter referred to as "EL") display panel comprising organic EL elements which emit light when electric charges are injected into them.

2. Background of the Related Art

The technology of organic EL devices, also called organic light emitting diodes (LEDs), has been rapidly advancing, and several prototype modules have been successfully demonstrated. Organic EL devices are extremely thin, matrix-addressable and are operable at a relatively low voltage, typically less than 15 volts. Furthermore, they have additional features suitable for next generation flat panel displays (FPDs). Some of these features include a low dependence on viewing angle and good device-formability on flexible substrates. A major drawback of liquid crystal displays, which are the most common display of choice, is that most of them require bright backlighting. The backlighting requirement can be easily eliminated by the use of an organic EL display.

Organic LEDs differ fundamentally from conventional inorganic LEDs. While the charge transfer in inorganics is band-like in nature and the electron-hole recombination results in the interband emission of light, organic films are generally characterized by low-mobility activated hopping transport, and excitonic emission. Organic EL devices are also substantially different from conventional inorganic EL devices, especially in that organic EL devices are operable at low DC voltages.

A substantial amount of research has been directed towards improving the efficiency and color control of organic LEDs. The efficiency of organic EL devices has now been demonstrated to be adequate for many commercial applications. Moreover, color control is probably not limiting for most potential applications. Accordingly, the outlook for organic EL devices in commercial applications is excellent. The performance of the organic EL devices is satisfactory for many applications. It is important to consider specific products and manufacturing techniques for the commercialization of organic EL devices. Consideration of specific applications leads us to believe that more work on manufacturability, uniformity, reliability, and systems issues is required to commercialize organic EL devices.

As shown in FIG. 1, the simplest way to drive an organic EL panel is to have organic function layers sandwiched between two orthogonal sets of electrodes, i.e., rows and columns. In this passive addressing scheme, the EL element serves both the display and switching functions. The diode-like nonlinear current-voltage characteristic of the organic EL element should, in principle, permit a high degree of multiplexing in this mode of addressing.

Pixelation or patterning, especially of electroluminescent and second electrode materials, is one of the key issues to be resolved before organic EL devices can be commercialized. The use of many conventional pixelation techniques is precluded due to the nature of organic materials, which are extremely vulnerable to most solvents.

The simplest patterning method is to use a shadow mask. As shown in FIGS. 1 and 2, the pixelation of an organic EL display panel can be accomplished by depositing second electrode material(s) 4 through the openings of a shadow mask 5 onto organic function layers 3 which are, in turn, laminated on a plurality of first electrode stripes 2. The first electrode stripes 2 are generally formed by patterning a layer of indium tin oxide (ITO) deposited on a transparent, insulating substrate 1.

Pixelation using a shadow mask becomes less efficient as the display resolution becomes finer. One possible solution, for a monochrome display, is to separate adjacent pixels using electrically insulating ramparts 6, as suggested in U.S. Pat. No. 5,701,055 and as shown in FIG. 3.

As disclosed in JP Laid Open Patent No. H8-315981, and as shown in FIGS. 4a–4d, the use of additional shadow masks may be required for the construction of a multi or full color display. The method disclosed in JP Laid Open Patent No. H8-315981 comprises: (1) putting a shadow mask with a plurality of openings (5-1, 5-2 or 5-3) onto top surfaces of the ramparts 6, and aligning each of said openings so they are over the gap between corresponding ramparts; (2) depositing organic EL medium layers of red (R) 4-1, green (G) 4-2 and blue (B) 4-3, one by one, through the openings 5-1, 5-2 and 5-3 respectively; and (3) forming at least one additional electrode layer 3 on said ramparts and said organic function layers.

The above method may work fine for a display of moderate resolution and size. However, as the display size increases and the pitch decreases, the above-described method reveals some limitations, i.e., difficulties in making the shadow mask itself, and difficulties in aligning the shadow mask with respect to the substrate. The need to accomplish pixelation without resorting to one or more shadow masks has been, in part, addressed in U.S. Pat. No. 5,693,962 and JP Laid Open Patent No. H9-293589.

FIGS. 5a–5c illustrate the fabrication steps of a full color panel, as disclosed in U.S. Pat. No. 5,693,962. FIG. 5a describes the formation process of a first sub-pixel 15-1, which comprises the steps of: (1) patterning a layer of organic or inorganic conductor deposited on a transparent substrate 11, by conventional lithographic techniques, to form a plurality of parallel conductive stripes for the first electrode 12; (2) depositing a layer of dielectric medium 13 on top of the conductive stripes 12 and on top of the exposed portions of the substrate 11; (3) spin-coating a photoresist (PR) layer 14-1, and patterning the dielectric medium 13 by a dry or wet etching technique; (4) laminating an electroluminescent medium 16-1; (5) forming a capping layer 17-1 of the sub-pixel by depositing an air-stable metal on top of the electroluminescent medium 16-1; and (6) removing the PR layer 14-1 and those on the PR layer by lift-off.

Acetone or a stripping solution is often used for lift-off. It is important to note that the electroluminescent medium 16-1 can be exposed, through the capping layer 17-1, to the solvents during the lift-off process. The device degradation due to this exposure is not surprising, given the relatively poor adhesion between an organic material and a metal used as a capping layer. As shown in FIGS. 5b and 5c, a second sub-pixel 15-2 and a third sub-pixel 15-3 can be fabricated by the same process.

FIGS. 6a–6j describe a processes of forming R, G, B sub-pixels, as disclosed in Japanese Laid Open Patent No. H9-293589. The process comprises the steps of: (1) forming a first electrode layer 22 on a transparent substrate 21, followed by the lamination of a red (R) electroluminescent medium 23, a second electrode 24, and a protection layer 25; (2) spin-casting a photoresist (PR) 26 and subsequently patterning red sub-pixels; and (3) repeating the above steps to form green and blue sub-pixels. During the above-described processing steps, active display elements are substantially exposed to PR 26, which is detrimental to device performance because of solvents remaining in the PR 26. In order to appreciated the adverse effects of photoresist, it is necessary to understand a typical photolithographic process. A typical photolithographic process involves spin-casting of a photoresist solution on the substrate, soft-baking and exposure to an ultraviolet ray, developing, and hard-baking. In the background art discussed herein, the panel is thereafter supposed to be subjected to etching and then PR stripping, which again requires stripping solution(s). During spin-casting, active EL elements are already exposed to solvents from the photoresist in a liquid phase.

In short, the background methods described above have a serious drawback. Active EL elements are inevitably exposed to various solvents from photoresist or developing and stripping solutions These solvents are extremely harmful to the electroluminescent medium, and adversely affects the device performance.

SUMMARY OF THE INVENTION

Accordingly, the present invention is directed to a novel method of fabricating an organic electroluminescent display panel that substantially obviates the problems associated with related art methods.

An object of the present invention is to provide a method of fabricating an organic EL display panel, wherein pixelation can be performed without resorting to the use of a shadow mask and also without active EL elements being exposed to solvents from photoresist or developing and stripping solutions.

The present invention may be achieved in whole or in part by a method of fabricating an organic electroluminescent (EL) display panel, comprising the steps of: (1) providing an organic function layer, said organic function layer comprising at least one organic EL medium layer laminated between first and second electrodes; and (2) pixelizing the organic function layer with at least one laser beam.

The present invention may also be achieved in whole or in part by a method of fabricating an organic EL display panel, comprising the steps of: (1) forming, in succession, a first electrode layer, organic function layers, including at least one organic EL medium layer, and a second electrode layer on a transparent substrate; and (2) removing, selectively, said second electrode layer and organic function layers in a predefined region with at least one laser beam.

The present invention may also be achieved in whole or in part by a method of fabricating an organic EL display panel, comprising the steps of: (1) forming a first electrode layer and an insulating layer, in succession, on a transparent substrate; (2) removing said insulating layer in a predefined region with at least one laser beam; (3) forming organic function layers and a second electrode layer, in succession, on the predefined region, inclusive of the insulating layer; and (4) repeating steps (2) and (3) at least once.

The present invention may also be achieved in whole or in part by a method of fabricating an organic EL display panel, comprising the steps of: (1) forming a first electrode layer and an insulating layer, in succession, on a transparent substrate; (2) removing said insulating layer in a predefined region with at least one laser beam; (3) forming organic function layers, a second electrode layer and a protection layer, in succession, on the predefined region inclusive of the insulating layer; and (4) repeating the steps of (2) and (3) once or more.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 5A–5C are sectional views showing the fabrication steps of a second related art multi-color display fabrication method;

DETAILED DESCRIPTION OF PREFERRED EMBODIMENTS

Reference will now be made in detail to the preferred embodiments of the present invention, examples of which are illustrated in the accompanying drawings.

For the fabrication of an organic EL display panel that has a plurality of emitting portions laminated between a plurality of first and second electrodes, the present invention utilizes a pixelation method that: (1) employs a laser-beam etching method; (2) does not use a shadow mask for pixelation; and (3) prevents active EL elements from being exposed to various solvents from photoresist, or developing and stripping solutions. Though the organic EL display panel of the present invention has a plurality of red (R), green (G) and blue (B) sub-pixels, only a single set of R, G and B sub-pixels is illustrated in the accompanying drawings, for purposes of clarity.

Figure 1:
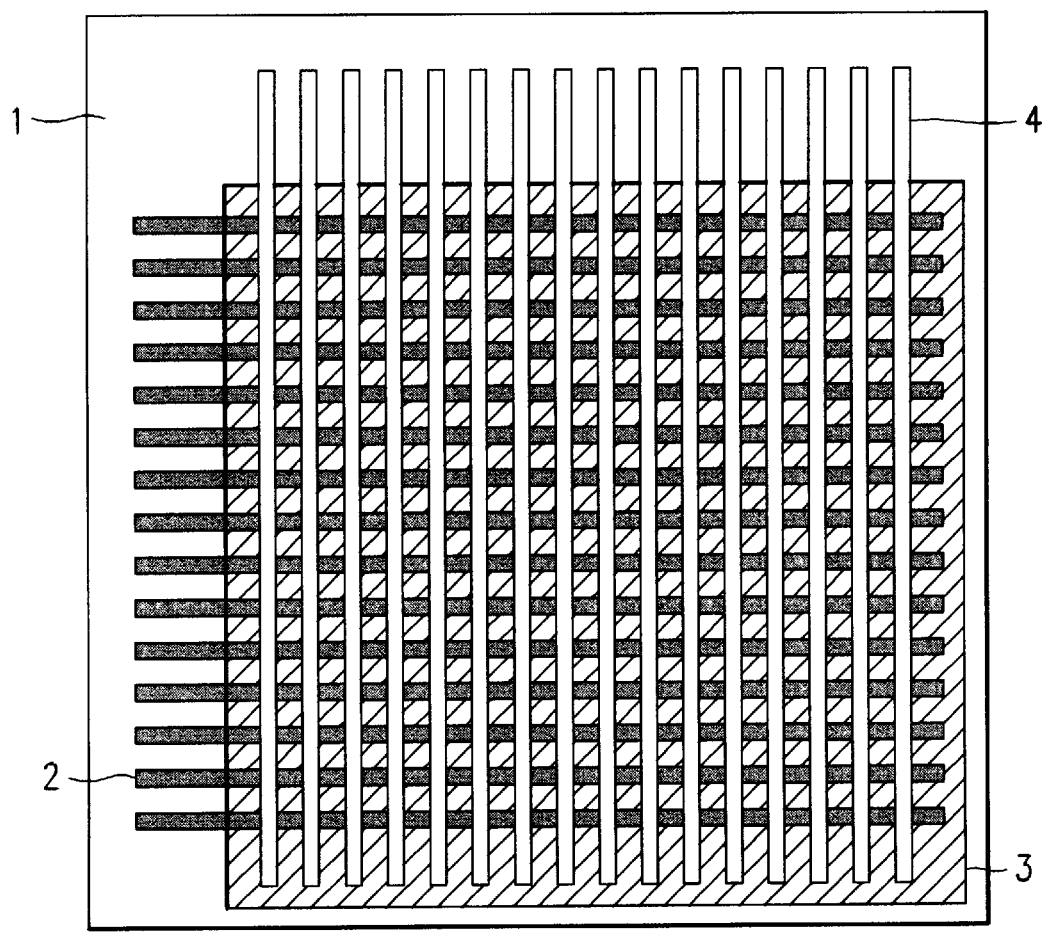
FIG. 1 is a plan view of a passively addressed organic EL display panel.
Figure 2:
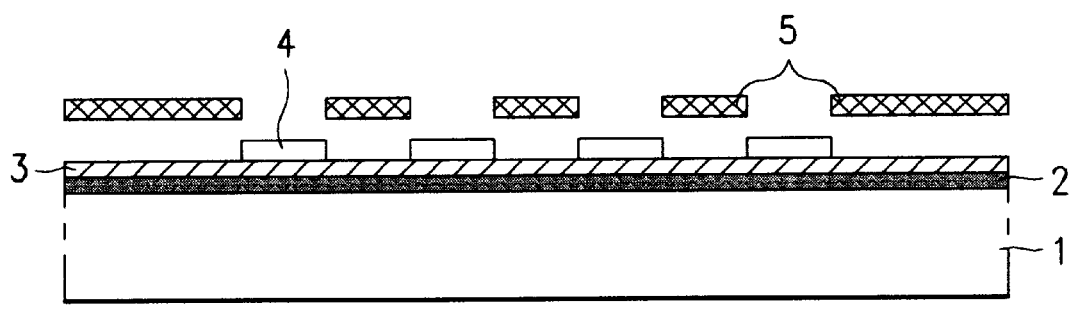
FIG. 2 is a cross-sectional view showing how a shadow mask is used to pattern the second electrode of the organic EL display panel of FIG. 1.
Figure 3:
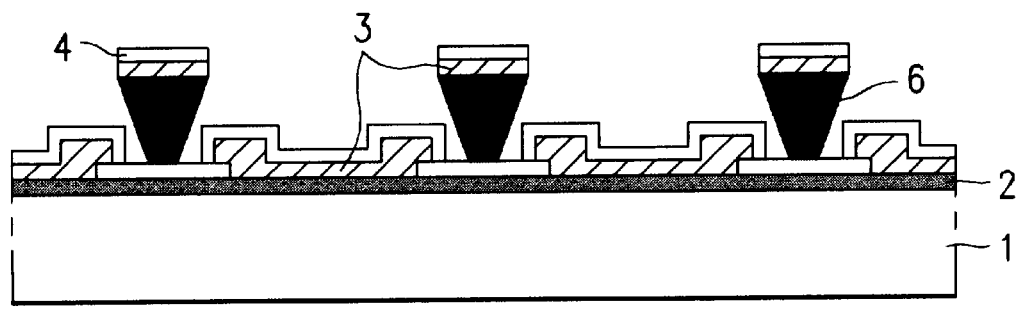
FIG. 3 is a sectional view of a monochrome that is pixelated using insulating ramparts.
Figure 4A:
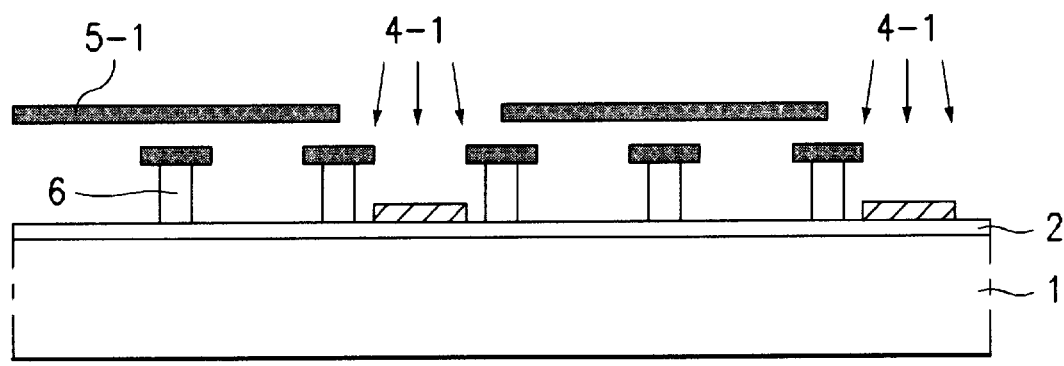
FIGS. 4A–4D are sectional views showing the fabrication steps of a first related art multi-color display fabrication method.
Figure 4B:
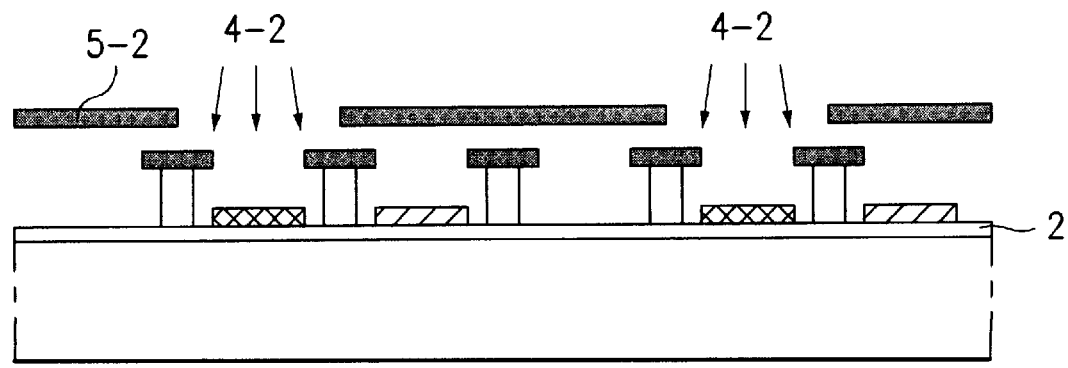
Figure 4C:
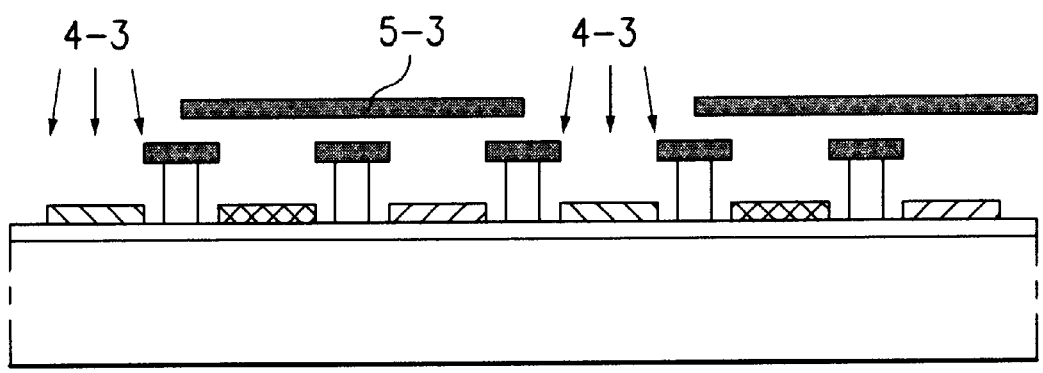
Figure 4D:
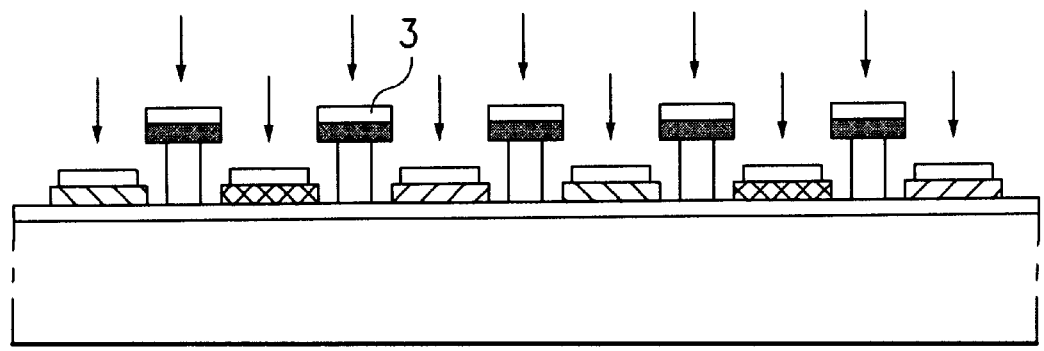
Figure 5A:
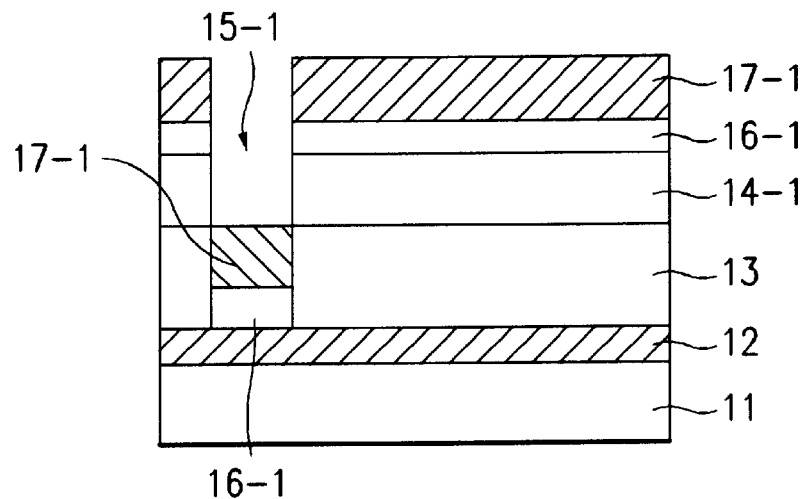
Figure 5B:
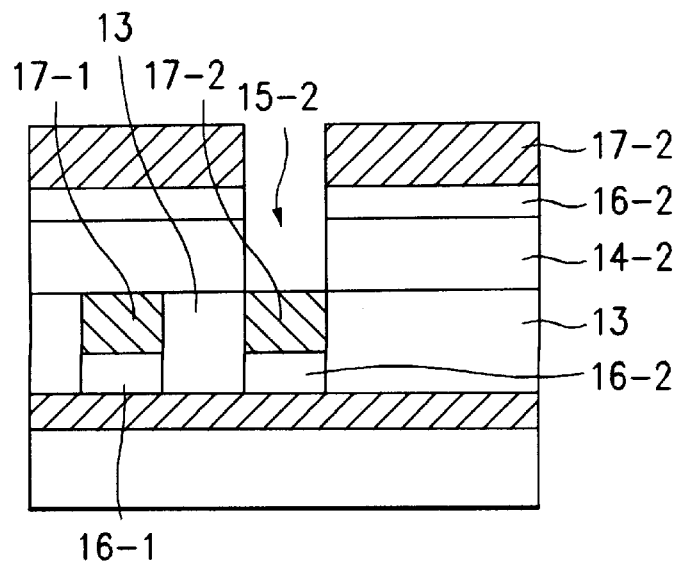
Figure 6A:
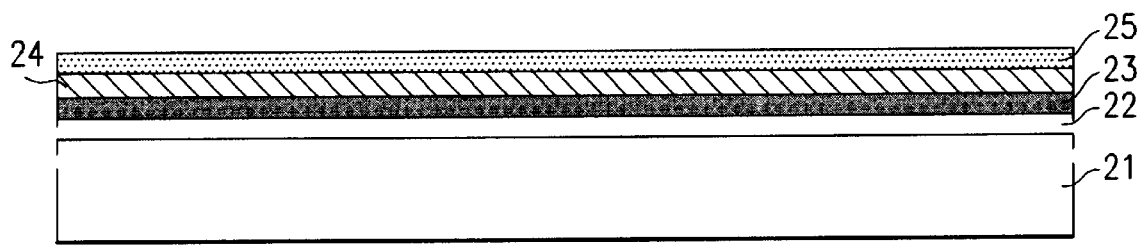
FIGS. 6A–6J are sectional views showing the fabrication steps of a third related art multi-color display fabrication method.
Figure 6B:
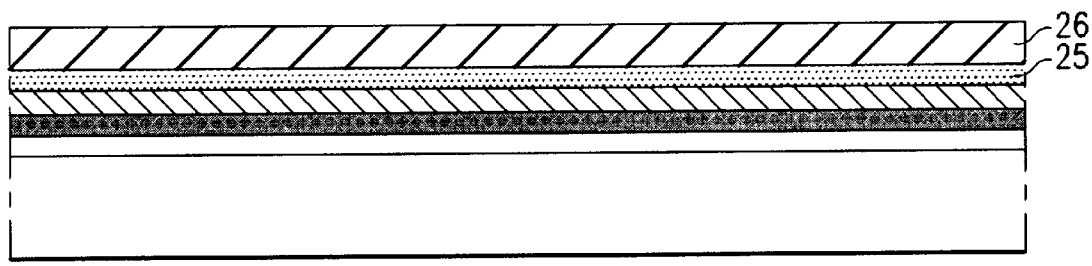
Figure 6C:
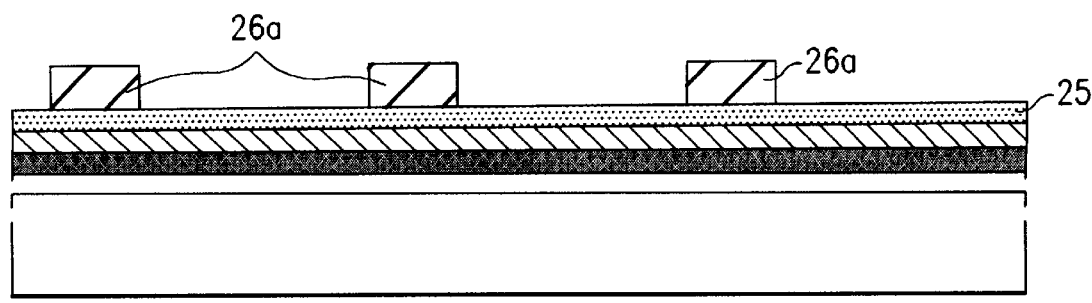
Figure 6D:
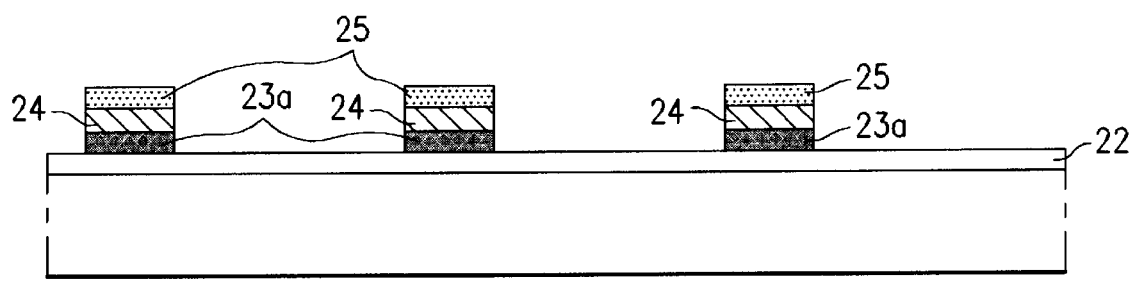
Figure 6E:
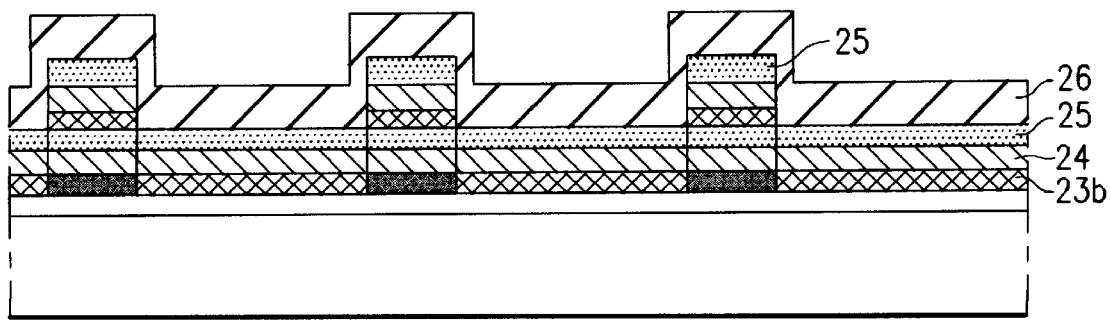
Figure 6F:
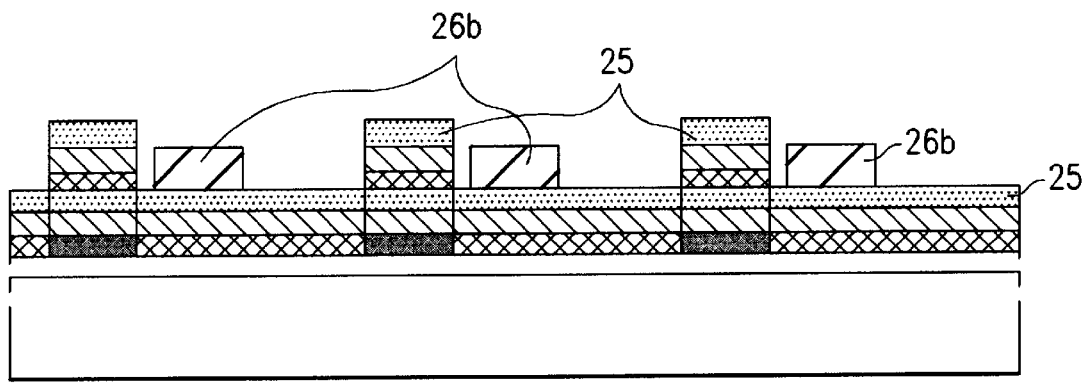
Figure 6G:
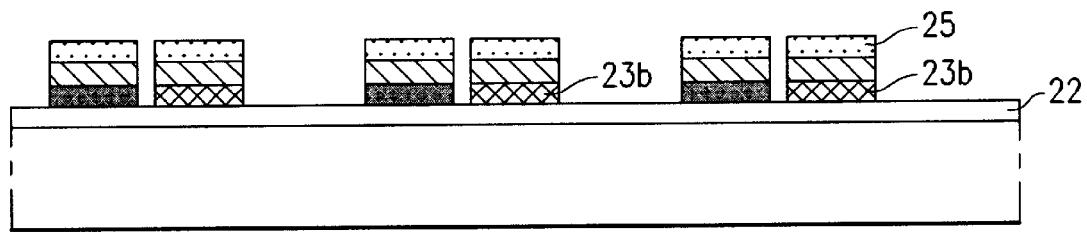
Figure 6H:
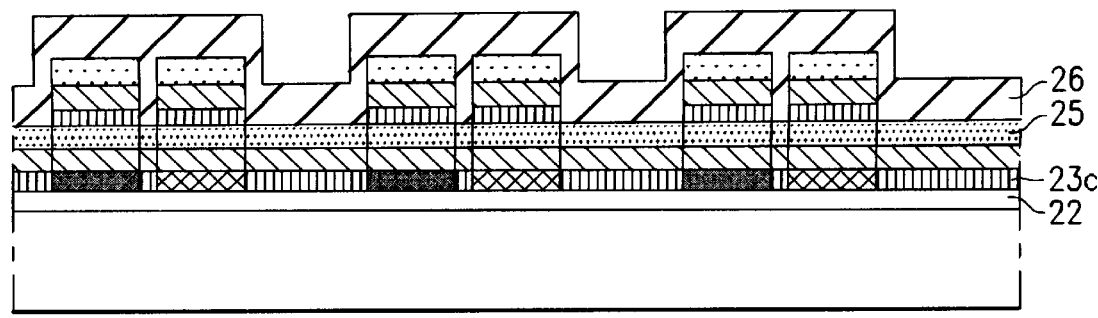
Figure 6I:
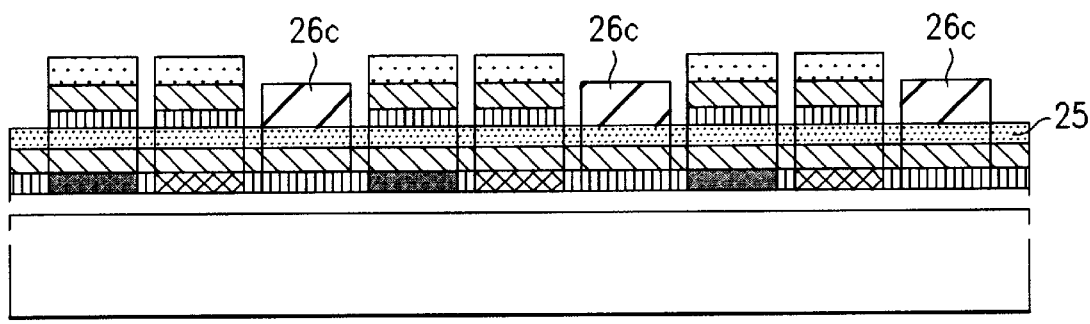
Figure 6J:
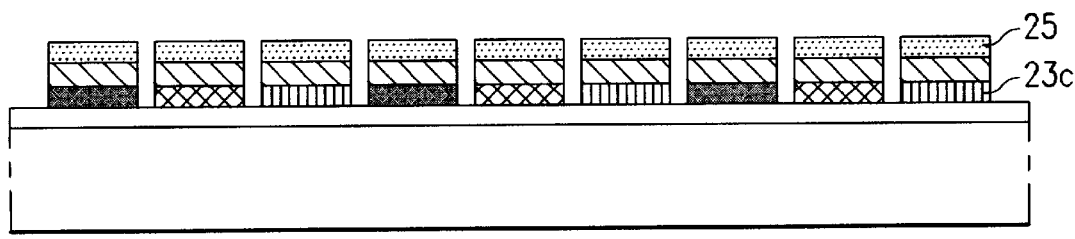
Figure 7A:
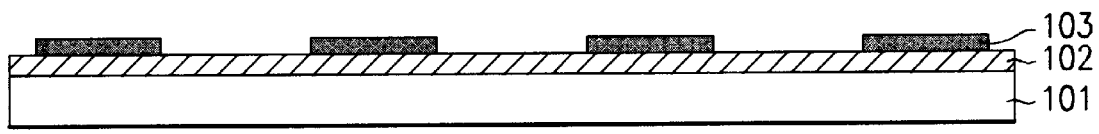
FIGS. 7A–7H are sectional views showing the fabrication steps of an organic EL display panel, in accordance with a first embodiment of the present invention.

FIGS. 7A–7H are sectional views showing the fabrication steps for an organic EL display panel, in accordance with a first embodiment of the present invention. Referring to FIG. 7A, the fabrication process of the present invention starts with forming stripes of first electrodes 102 by photolithographically patterning a transparent layer. The transparent layer is preferably an indium tin oxide (ITO) layer deposited on a transparent substrate 101. Stripes of an electrically insulating buffer layer 103 are then formed in an orthogonal relationship to the stripes of first electrodes 102. The buffer layer 103, being not luminescent, reduces leakage current by lowering the probability that the first electrodes 102 will be microscopically short-circuited to second electrodes that are to be formed in a later step The buffer layer 103 can be formed by depositing, and is preferably an inorganic compound, such as silicon oxide or silicon nitride, or a polymeric material, such as polyimide. The buffer layer 103 is preferably deposited by vapor deposition, e-beam evaporation, RF sputtering, chemical vapor deposition (CVD), spin coating, dipping, doctor blade method, electro- or electroless plating, or screen printing method.

Figure 7B:
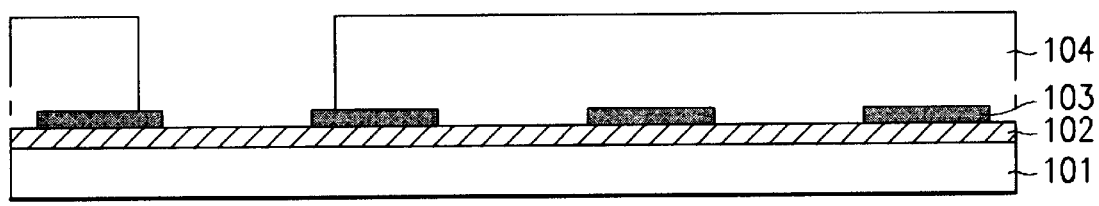

Next, as shown in FIG. 7B, an insulating layer 104 is formed on a predefined surface, including the buffer layer 103, and laser-beam etching is performed to remove portions of the insulating layer 104 at the locations where red emitting sub-pixels are to be formed in the next step. The material for the insulating layer 104 should have a considerable absorption cross-section at the wavelength of the laser beam used, and should also have a good film-forming characteristic. The insulating layer 104 is preferably polymeric, e.g., photoresist, and is preferably formed to a thickness of 0.1 $\mu$m–100 $\mu$m. The part of the coated substrate where sub-pixels are to be formed can be optionally treated with oxygen plasma or UV/ozone.

One difference between the background art and the present invention is the fact that, in the process of the present invention, the photoresist step is performed before the lamination of any electroluminescent medium. Accordingly, the photoresist used in the present invention can be hard-baked at a high enough temperature for a sufficient amount of time to ensure complete elimination of any residual solvents inside the PR film. If an EL medium is subjected to such harsh conditions, it will degrade very quickly. Thus, the photoresist used in the background art can not be completely baked. In contrast, the photoresist used in the present invention does not adversely effect the device performance.

Figure 7C:
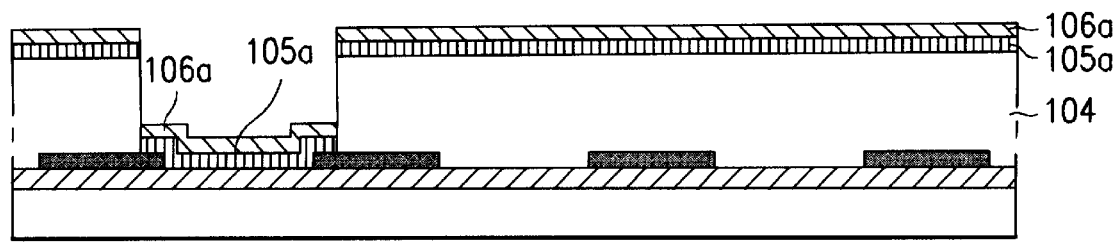

Next, as shown in FIG. 7C, a first organic function layer 105a (for example, red light emitting layers) and a second electrode layer 106a are deposited, in succession, on the predefined surface, including the insulating film 104. The first organic function layer 105a is suitably: (1) a buffer layer of copper phthalocyanine (CuPc), preferably 10 nm–20 nm thick; (2) a hole transporting layer of N,N'-diphenyl-N,N'-bis(3-methylphenyl)-(1,1'-biphenyl)-4,4'-diamine TPD), preferably 30 nm–50 nm thick; and (3) an emitting layer of tris(8-hydroxy-quinolate)aluminum (Alq$_3$), preferably 40 nm–60 nm thick, doped with DCM 2 for red emission. The second electrode 106a is preferably formed from one of Al, Ca, Mg:Ag, and Al:Li.

Figure 7D:
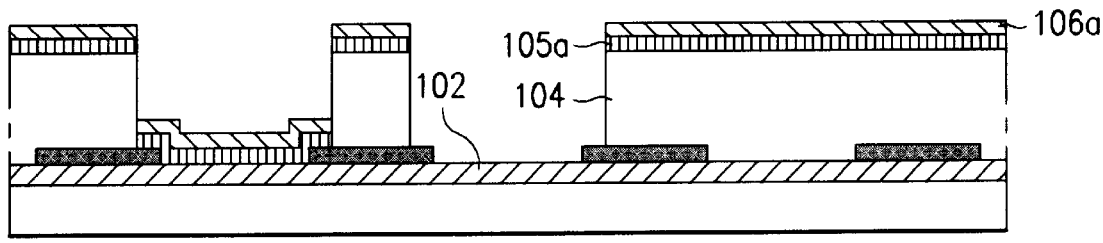
Figure 7E:
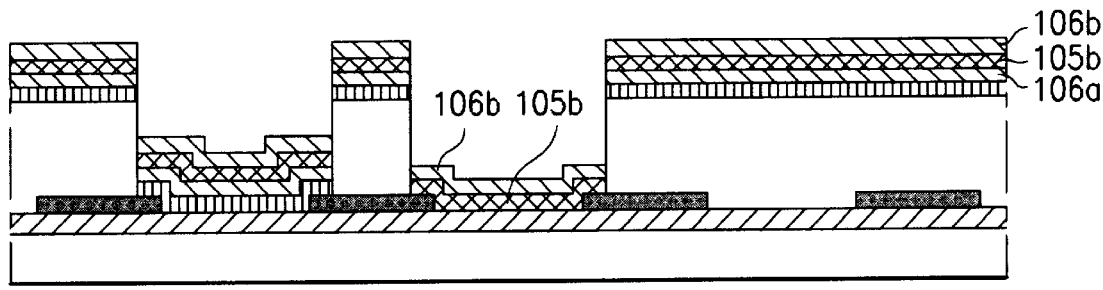

Next, as shown in FIG. 7D, another portion of the insulating layer 104 is etched out with a laser beam. Following an optional oxygen plasma or UV/ozone surface treatment, a second organic function layer 105b (for example, a green light emitting layer) and a second electrode layer 106b are deposited, as shown in FIG. 7E. A preferred green light emitting EL medium is coumarin 6 doped Alq$_3$.

Figure 7F:
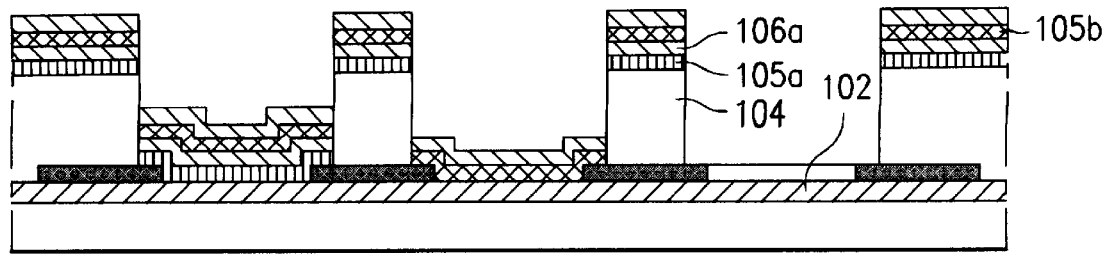
Figure 7G:
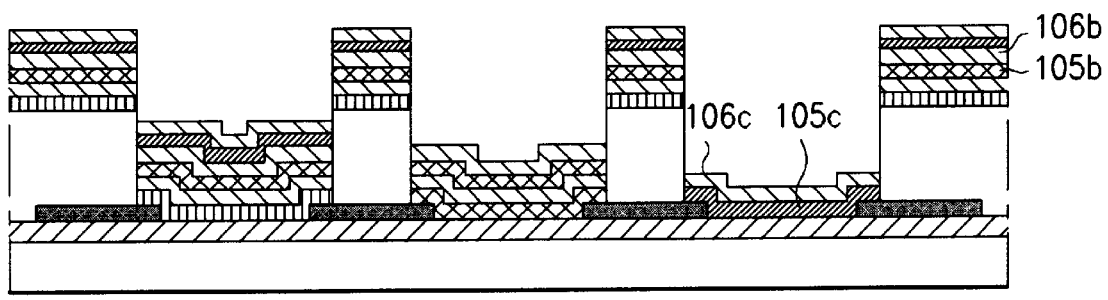
Figure 7H:
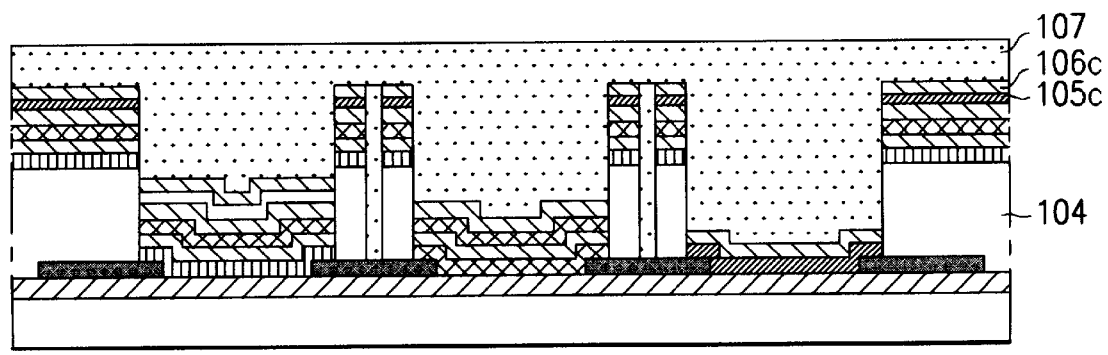

FIGS. 7F and 7G illustrate the repetition of the above-described steps for the formation of sub-pixels for the third color, blue in this example. BAlq$_3$ doped with perylene is preferably used for the blue emitting EL medium. To ensure that two adjacent sub-pixels are electrically insulated, the organic function layers and second electrode layers located between two adjacent sub-pixels are cut into two parts by laser scribing with a laser beam, as shown in FIG. 7H. Next, the panel is covered with a protection layer 107, primarily to prevent moisture from penetrating into active EL elements, and is subsequently subjected to an encapsulation process. The protection layer 107 preferably contains one or a mixture of moisture absorbing ingredients. The formation of the protection layer 107 may alternatively be performed prior to the laser scribing described above.

Figure 8A:
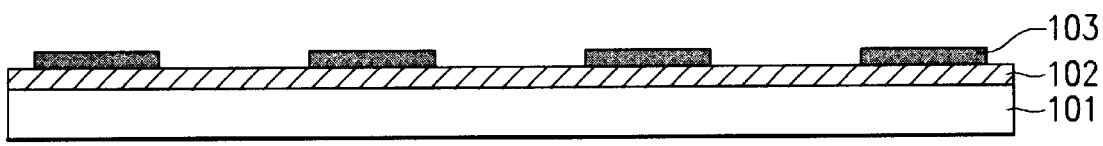
FIGS. 8A–8K are sectional views showing the fabrication steps of an organic EL display panel, in accordance with a second embodiment of the present invention.
Figure 8B:
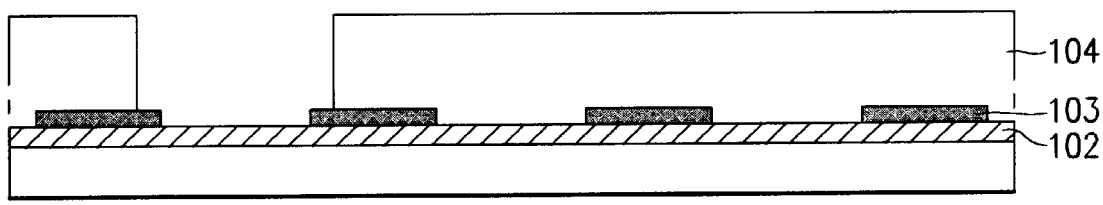
Figure 8C:
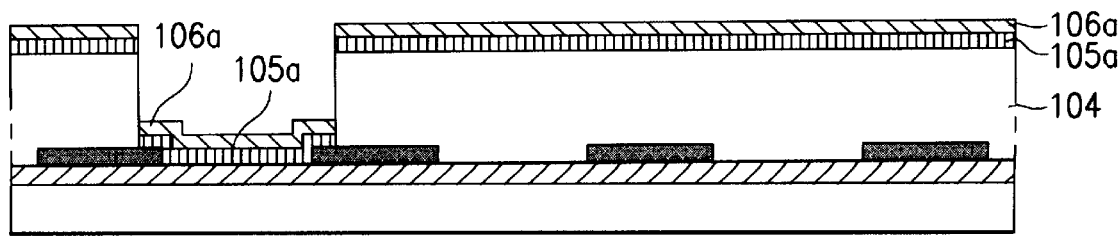
Figure 8D:
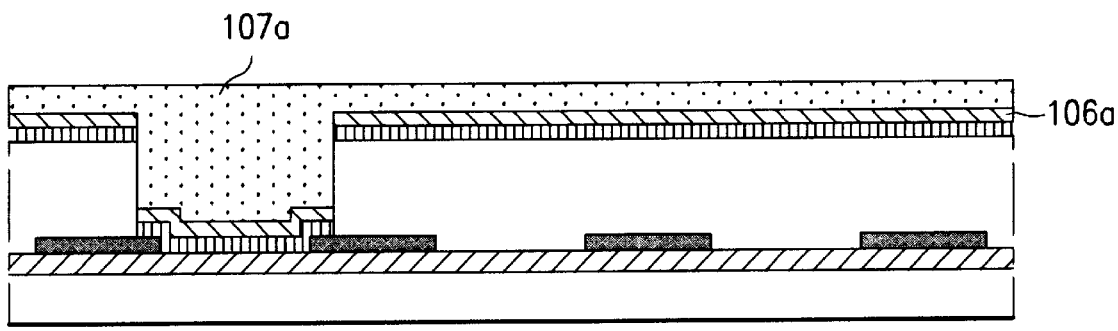
Figure 8E:
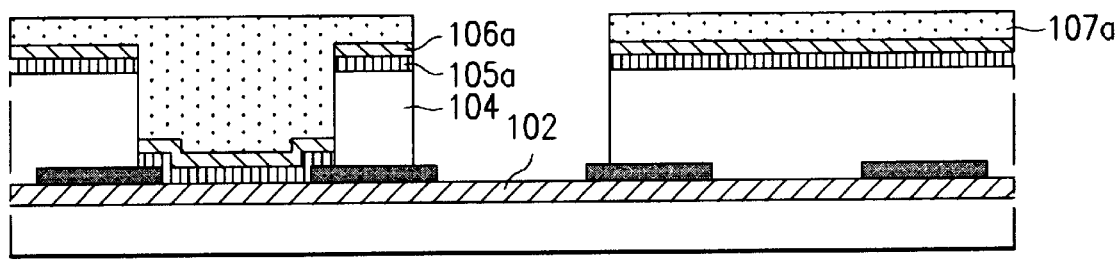
Figure 8F:
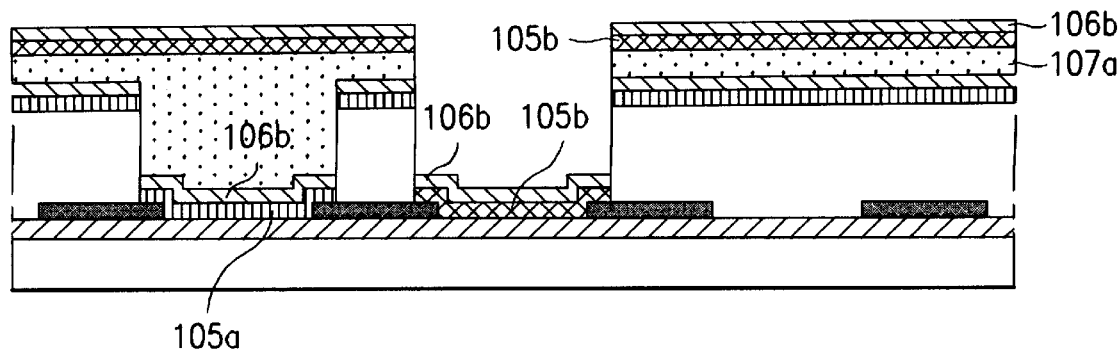
Figure 8G:
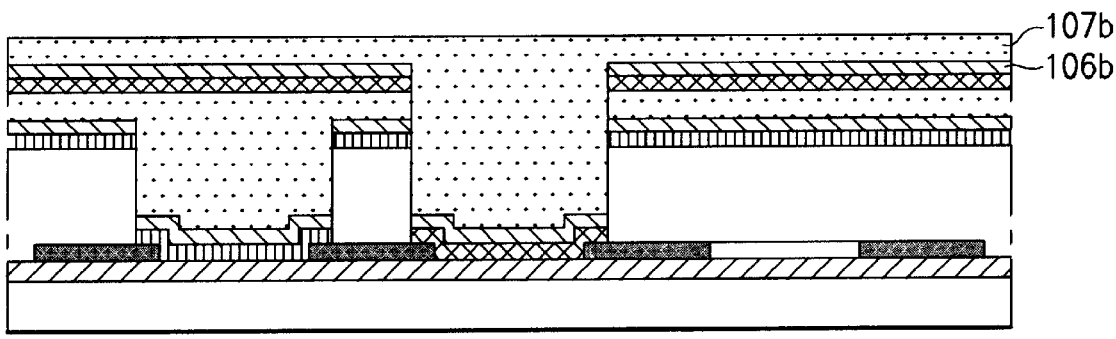
Figure 8H:
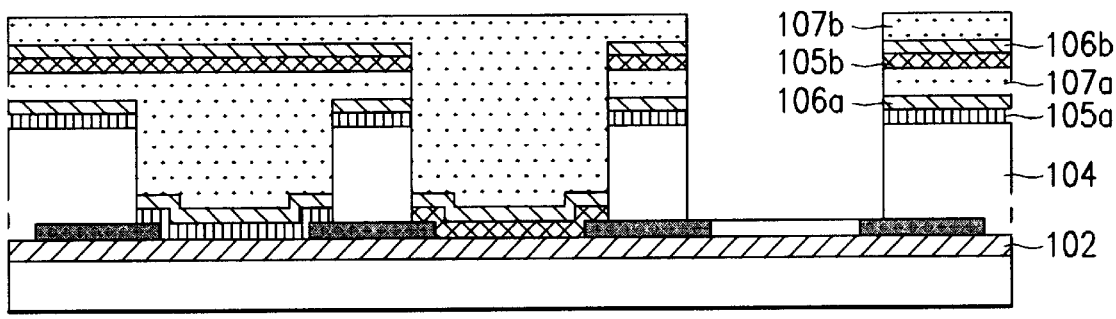
Figure 8I:
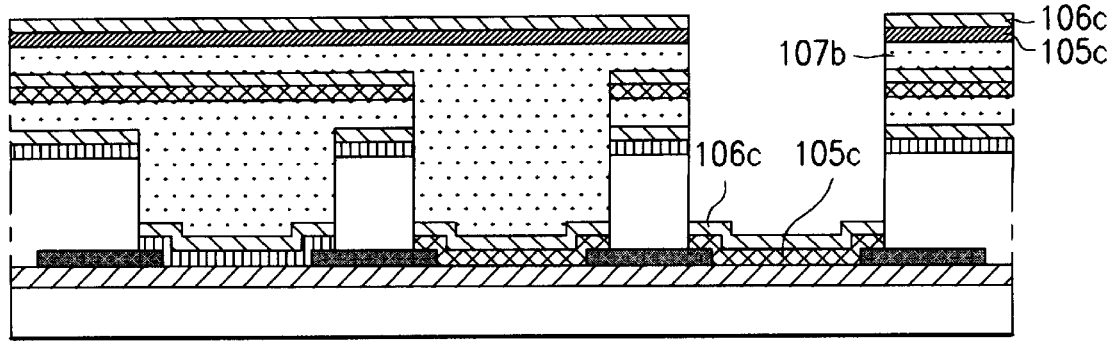
Figure 8J:
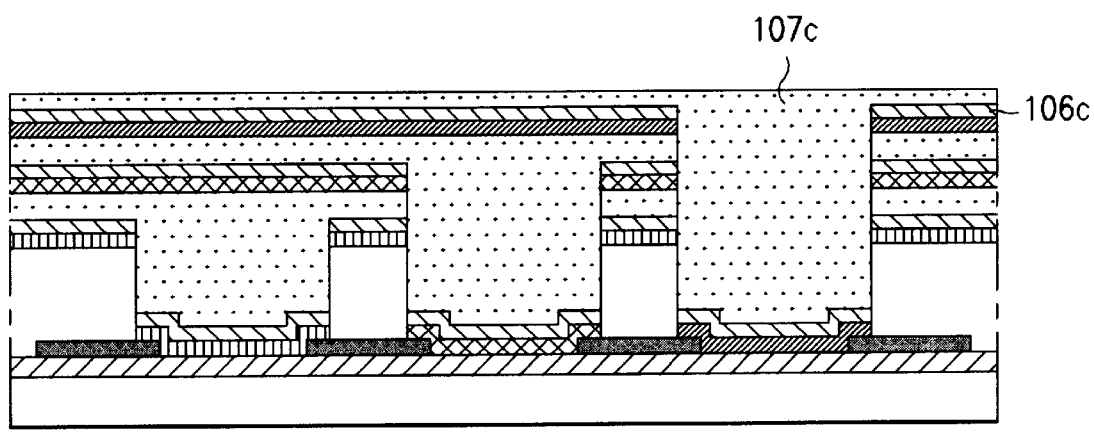
Figure 8K:
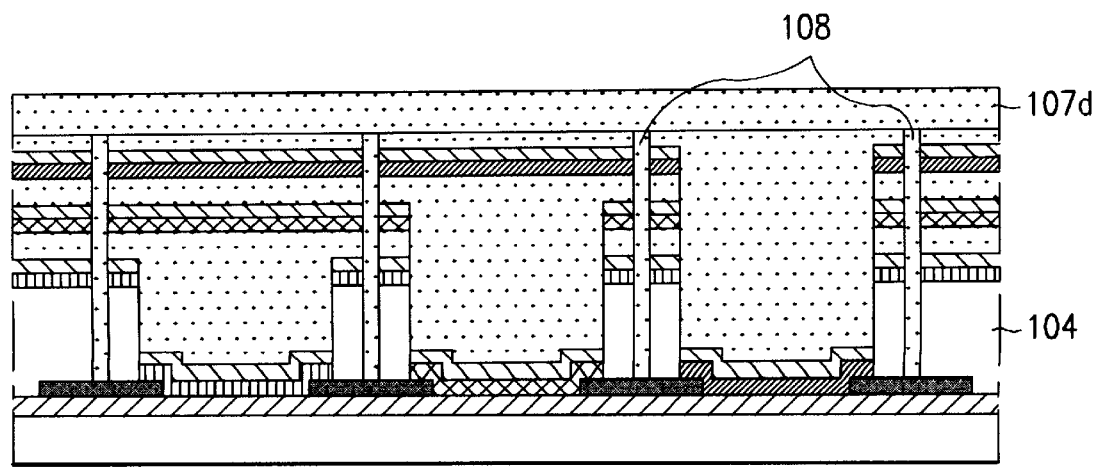

FIGS. 8A–8K are sectional views showing the fabrication steps for an organic EL display panel, in accordance with a second embodiment of the present invention. The second embodiment of the fabrication process of the present invention is the same as the first embodiment described above, except that a protection film is coated on top of each sub-pixel after each sub-pixel is formed. Specifically, the first and second sub-pixels are coated with protection layers 107a and 107b, shown in FIGS. 8D and 8G, respectively, before the formation of the third sub-pixel, and a protection layer 107c is additionally coated after the formation of the third sub-pixel, as shown in FIG. 8J. Since the protection layers 107a and 107b help shield the first and second sub-pixels, respectively, from moisture and solvents during the subsequent process steps, long-term stability is improved and, furthermore, more freedom in the process design is gained. The inner protection layers 107a, 107b and 107c remain under the outermost protection layer 107d, even after fabrication of the device is completed. Therefore, the inner protection layers 107a, 107b and 107c preferrably contain one or a mixture of moisture absorbing ingredients.

An advantage of the present invention is the simplicity of the sequence of sub-pixel formation steps, i.e, the repetition of the laser-beam etching and the formation of EL elements. Details of laser-beam etching techniques and process requirements will now be discussed.

Figure 9:
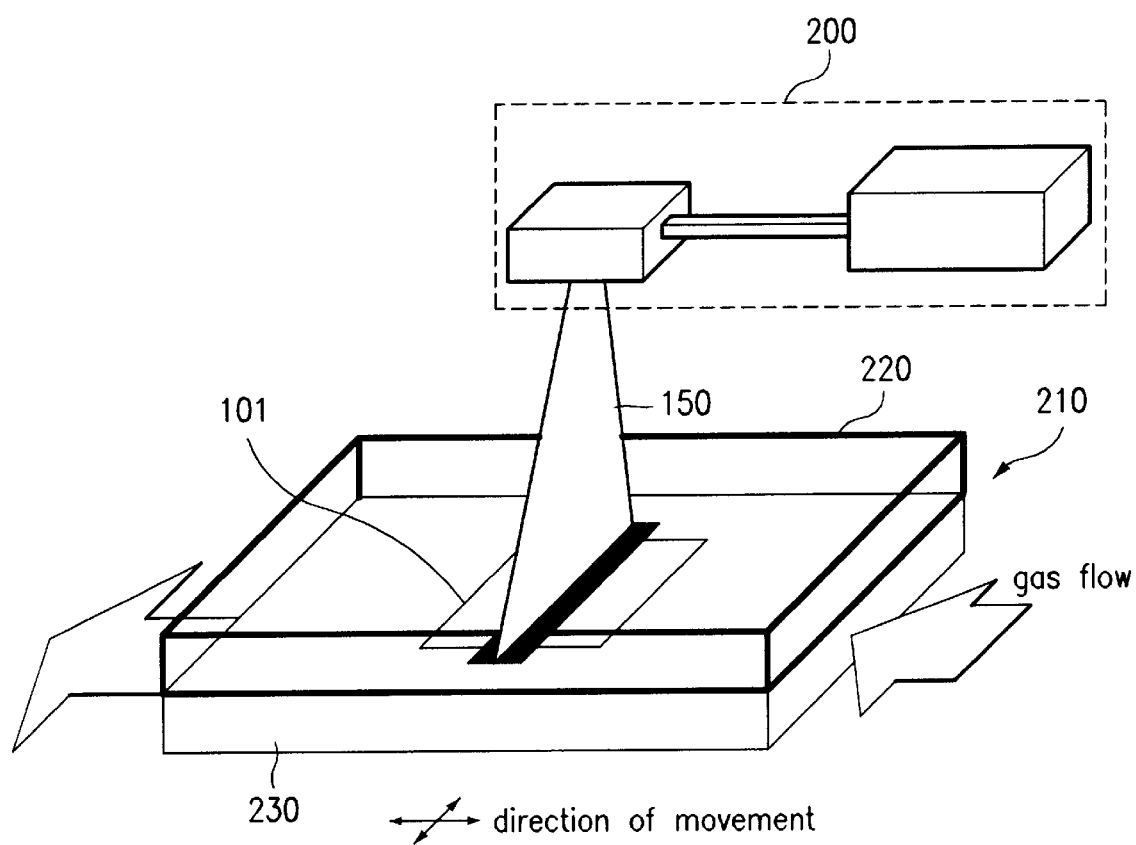
FIG. 9 illustrates an exemplary laser-beam etching system, in accordance with the present invention.

In order to prevent the degradation of active display elements during the etching process, the panel being processed should be located either in a vacuum, preferably in a vacuum chamber, or in a dry or inert atmosphere, preferably in a glove box filled with inert gas. However, the laser beam generator does not have to be operated in the same controlled atmosphere that surrounds the panel. As shown in FIG. 9, the laser beam 150 from the laser generator 200 is guided into the chamber 210 (i.e., vacuum chamber or glove box) through a window 220 that exhibits low absorption at the laser beam wavelength. Depending on the system design, either the laser beam 150 is scanned or, as shown in FIG. 9, the substrate 101 is mounted on a programmable movable stage 230. Scanning the laser beam 150 is a less suitable method for applications that require accurate position control, such as the fabrication method of the present invention. The movable stage 230 may have encoders or sensors attached for feedback control. In addition, the inventors have discovered that the optical and electrical properties of ITO can be used for feedback control of the movable stage position.

A laser beam 150 at an appropriate wavelength should be selected, based on the physical and chemical properties of the materials to be etched. An important factor is the absorption cross-section as a function of wavelength. The most commonly used lasers for etching metals and organic materials are a frequency-doubled Nd:YAG laser with a green emission, and an excimer laser with an ultraviolet emission. In the present invention, the laser is preferably operated in a pulse mode rather than a continuous mode, because operating in continuous mode may cause thermal damage to the device. The laser power and pulse repetition rate should be optimized to ablate the second electrode layer and the organic function layers, but not to damage the first electrode. Table 1 below lists lasers that are suitable for practicing the present invention.

TABLE 1

| laser | gas | wavelength (μm) | remarks |
|---|---|---|---|
| Nd:YAG | Not Applicable | 1.06 | |
| Nd:YAG | Not Applicable | 0.53 | Frequency Doubled |
| Er:YAG | Not Applicable | 2.9 | |
| Ho:YAG | Not Applicable | 1.9 | |
| Excimer | $F_2$ | 0.16 | |
| Excimer | ArF | 0.19 | |
| Excimer | KrF | 0.25 | |
| Excimer | XeCl | 0.31 | |
| Excimer | XeF | 0.35 | |
| Excimer | Ar | 0.52 | |
| Excimer | $N_2$ | 0.34 | |

Figure 10:
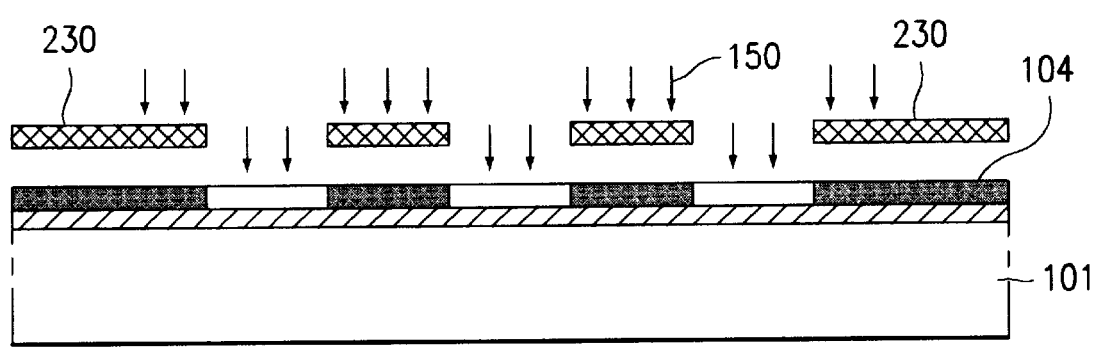
FIG. 10 illustrates a laser-beam etching process using a mask, in accordance with the present invention.

Depending on the process design, the laser beam may be directed into the panel from the first electrode side or from the second electrode side. ITO, a typical first electrode material, does not have a large absorption cross-section at a wavelength of 0.53 μm. Thus, a frequency-doubled Nd:YAG laser is preferrably directed into the panel from the ITO side to etch organic function layers and the second electrode. Etching rates of certain materials may be enhanced if a single or a plurality of appropriate reactive gases are introduced together with the laser beam. The shape and size of the laser beam spot may be adjusted as necessary. In addition, a plurality of sub-pixels may be etched simultaneously with the use of a properly designed etching mask 230, as shown in FIG. 10. Irradiating a large area at a time requires a laser system with a large beam spot and high power.

The method of fabricating an organic EL display panel of the present invention has the following advantages. First, the production yield is significantly increased because a simple and fast laser processing method is employed, and also because a shadow mask, which is difficult to make and even more difficult to accurately align with respect to a substrate, is not used in the fabrication process. Furthermore, the long-term stability of the display panel is much improved by minimizing the exposure of active EL elements to detrimental solvents and moisture.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art In the claims, means-plus-function clauses are intended to cover the structures described herein as performing the recited function and not only structural equivalents but also equivalent structures. For example, although a focusing mirror and a lens may not be structural equivalents in that a focusing mirror employs a curved reflective surface to focus light, whereas a lens employs a curved transmissive surface to focus light via refraction in the environment of focusing light, a focusing mirror and a lens may be equivalent structures.

What is claimed is:

1. A method of fabricating an organic electroluminescent (EL) display panel, comprising:
   forming a first electrode layer on a transparent substrate;
   forming an insulating layer having an insulating surface on the first electrode layer;
   selectively removing portions of the insulating layer at predetermined first regions using at least one laser beam to expose a first set of first sub-pixel electrodes;
   forming a set of organic function layers on the first set of first sub-pixel electrodes and on remaining portions of the insulating surface, said organic function layers comprising at least one organic EL medium layer; and
   forming a set of second electrode layers on the organic function layers to form a second set of first sub-pixel electrodes, wherein the first set of first sub-pixel electrodes, the portions of the organic function layers electrically communicating with the first set of first sub-pixel electrodes and the second set of the sub-pixel electrodes and the second set of first sub-pixel electrodes form a first set of first sub-pixels wherein the remaining portions of the insulating layer following selective removal of the predetermined first regions separate a sub-pixel from other sub-pixels.

2. The method of claim 1, further comprising forming a second set of sub-pixels by selectively removing portions of the insulating layer at predetermined second regions using at least one laser beam, forming a second organic function layer on the predetermined second regions on remaining portions, said second organic function layer comprising at least one organic EL medium layer and forming a third electrode layer on the second organic function layer, wherein the first electrode layer, the portions of second organic function layer electrically communicating with the first electrode layer and the third electrode layer and the third electrode layer from a second set of second sub-pixels.

3. The method of claim 1, further comprising forming a buffer layer between the insulating layer and the first electrode layer.

4. The method of claim 3, wherein the buffer layer is formed of an electrically insulating inorganic or electrically insulating organic material.

5. The method of claim 1, wherein the insulating layer is formed of at least one polymeric material.

6. The method of claim 1, wherein the insulating layer is formed to a thickness of 0.1 μm–100 μm.

7. The method of claim 1, wherein selectively removing portions of the insulating layer is conducted in a vacuum, or in a dry atmosphere, or in an inert atmosphere.

8. The method of claim 2, further comprising forming a protection layer over said organic EL display panel.

9. The method of claim 8, wherein the protection layer comprises at least one moisture absorbing material.

10. A method of fabricating an organic EL display panel, comprising:
   forming a first electrode layer on a transparent substrate;
   forming an insulating layer having an insulating surface on the first electrode layer;
   selectively removing portions of the insulating layer at predetermined first regions to expose a first set of first sub-pixel electrodes using at least one laser beam;
   forming a set of organic function layers on the first set of first sub-pixel electrodes and on remaining portions of the insulating surface, said organic function layers comprising at least one organic EL medium layer; and
   forming a set of second electrode layers on the organic function layers to form a second set of first sub-pixel electrodes; and
   forming a protection layer on at least the second set of first sub-pixel electrodes, wherein the first set of first sub-pixel electrodes, the organic function layers the second set of first sub-pixel electrodes and the protective layer form a first set of first sub-pixels wherein individual sub-pixels are defined through laser removal of the insulating layer without removal of portions of the first electrode material, second electrode material, and organic function layer materials which are used to form the set of sub-pixels.

11. The method of claim 10, further comprising forming a second set of sub-pixels by selectively removing portions of the insulating layer at predetermined second regions using at least one laser beam, forming a second organic function layer on the predetermined second regions and on remaining portions, said second organic function layer comprising at least one organic EL medium layer and forming a third electrode layer on the second organic function layer, wherein the first electrode layer, the portions of second organic function layer electrically communicating with the first electrode layer and the third electrode layer and the third electrode layer form a second set of second sub-pixels.

12. The method of claim 10, wherein the protection layer comprises at least one moisture absorbing material.

13. The method of claim 10, further comprising forming a buffer layer between the insulating layer and the first electrode layer.

14. The method of claim 11, further comprising forming a protection layer over said organic EL display panel.

15. The method of claim 14, wherein the additional protection layer comprises at least one moisture absorbing material.

16. A method of fabricating an organic EL display panel, comprising:

forming a first electrode layer on a transparent substrate;

forming an insulating layer on the first electrode layer;

selectively removing portions of the insulating layer at predetermined first regions using at least one laser beam;

forming a first organic function layer on the predetermined first regions, said first organic function layer comprising at least one organic EL medium layer; and, forming a second electrode layer on the first organic function layer, wherein the first electrode layer, the first organic function layer and the second electrode layer from a first sub-pixel;

selectively removing portions of the insulating layer at predetermined second regions using at least one laser beam;

forming a second organic function layer on the predetermined second regions, said second organic function layer comprising at least one organic EL medium layer; and, forming a third electrode layer on the second organic function layer, wherein the first electrode layer, the second organic function layer and the third electrode layer from a second sub-pixel;

wherein the first and second organic function layers and the second and third electrode layers are also formed on the insulating layer, and further comprising cutting, into two parts, the first and second organic function layers and the second and third electrode layers formed on the insulating layer between the first and second sub-pixels.

* * * * *